United States Patent [19]

Daly

[11] Patent Number: 4,979,636
[45] Date of Patent: Dec. 25, 1990

[54] HOUSING ASSEMBLY FASTENING

[75] Inventor: John J. Daly, San Carlos, Calif.

[73] Assignee: Grid Systems Corporation, Fremont, Calif.

[21] Appl. No.: 365,287

[22] Filed: Jun. 12, 1989

[51] Int. Cl.⁵ ............................................. B65D 43/02
[52] U.S. Cl. ................................. 220/324; 174/65 R; 220/326; 361/390; 364/708
[58] Field of Search ............ 174/65 R; 206/305, 320; 220/4 B, 4 R, 324, 326, 306, 307; 312/107; 361/390; 364/706, 708; 455/349

[56] References Cited

U.S. PATENT DOCUMENTS

| | | | |
|---|---|---|---|
| 2,957,599 | 10/1960 | Lamb | 220/4 R |
| 3,390,806 | 7/1968 | Herbert | 220/324 |
| 3,400,226 | 9/1968 | Krumreich et al. | 220/4 B |
| 4,286,124 | 8/1981 | Guttmann | 220/4 R |
| 4,522,310 | 6/1985 | Mikic et al. | 220/4 R |
| 4,706,808 | 11/1987 | Guetersloh | 206/305 |
| 4,742,478 | 5/1988 | Nigro, Jr. | |

Primary Examiner—Jimmy G. Foster
Attorney, Agent, or Firm—Townsend & Townsend

[57] ABSTRACT

This invention relates to a housing assembly design which reduces the number of screws required to attach the housing parts together. According to the preferred embodiment of this invention, the housing of a hand-held computer is assembled and held together by a combination of hooks, screws, and tabs. Preferably, the tabs mate with slots or grooves formed on the perimeter of apertures such as input/output ports in the housing. Once the housing is assembled, each tab forms part of the perimeter of the aperture into which it is inserted. The hooks and screws mate with corresponding hooks and screw holes, respectively, formed in the housing.

4 Claims, 2 Drawing Sheets

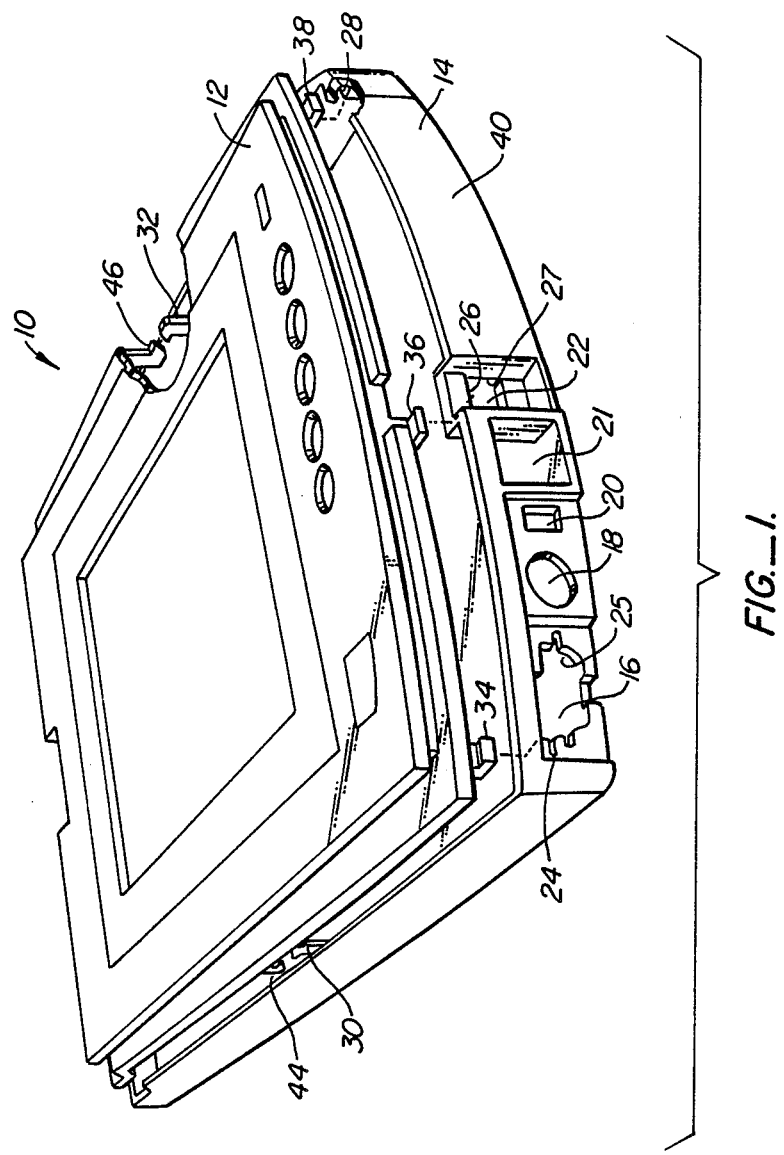
FIG._1.

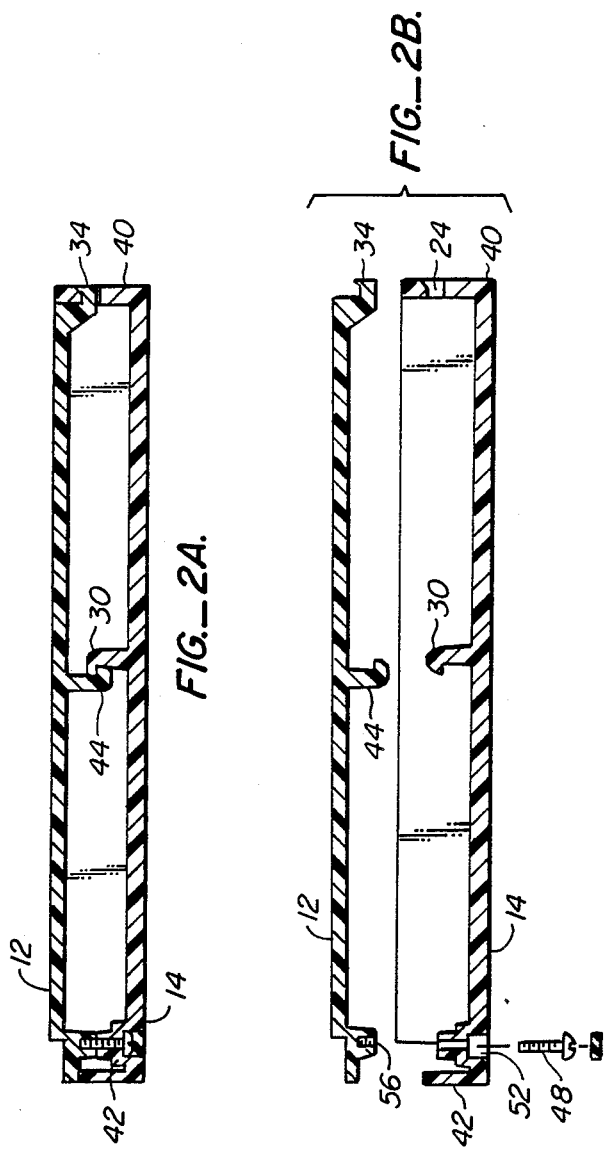

HOUSING ASSEMBLY FASTENING

BACKGROUND OF THE INVENTION

This invention relates to fasteners for housing assemblies in general and particularly to housing assemblies for hand-held computers.

Computer housings are typically formed in several pieces from metal or plastic. After attaching the internal components to the housing parts, the several housing parts must be attached to each other. The most common method of attaching housing parts to each other is by metal or plastic screws.

SUMMARY OF THE INVENTION

One way to minimize manufacturing costs is to minimize manufacturing time and labor. Forming threaded screw holes in the housing parts after forming the housing parts themselves takes an extra manufacturing step, thereby requiring more manufacturing time and labor. What is needed, therefore, is a housing design which minimizes the number of threaded screw holes which must be formed in the housing parts.

One way to minimize manufacturing time and labor is to minimize the number of assembly steps and the time required to perform the steps. One drawback of using screws to assemble housings is the time it takes a laborer to insert the screws into the housing. What is needed, therefore, is a housing attachment mechanism that minimizes the number of screws needed to assemble the housing.

Another way to minimize manufacturing time and labor is to minimize the number of features on the manufactured item. Attachment mechanisms are typically totally dedicated features, i.e., the attachment features do not perform any other function within the overall device. A design which assigned attachment functions to features that perform other functions as well would minimize the manufacturing cost of the housing. What is needed, therefore, is a housing attachment design which utilizes other features to perform attachment functions.

This invention meets these and other needs by providing a housing assembly design which reduces the number of screws required to attach the housing parts together. According to the preferred embodiment of this invention, the housing of a hand-held computer is assembled and held together by a combination of hooks, screws, and Preferably, the tabs mate with slots or grooves on the perimeter of apertures such as input/output ports in the housing. Once the housing is assembled, each tab forms part of the perimeter of the aperture into which it is inserted. The hooks and screws mate with corresponding hooks and screw holes, respectively, formed in the housing.

BRIEF DESCRIPTION OF THE DRAWINGS

FIG. 1 is an exploded elevational view of the preferred embodiment of this invention;

FIG. 2A is a sectional view of the preferred embodiment; and

FIG. 2B is an exploded sectional view of the preferred embodiment.

DETAILED DESCRIPTION OF THE PREFERRED EMBODIMENT

FIG. 1 shows a computer housing assembly 10 made up of least two parts, an upper cover 12 and a lower housing 14. Cover 12 and housing 14 may be formed from injection molded plastic or from any other suitable material. A series of ports 16, 18, 20, 21 and 22 are formed as apertures in lower housing 14.

The perimeter 25 of port 16 is generally shaped as a receptacle for a serial connector. Perimeter 25 of port 16 is extended in one corner to form a slot 24. The perimeter 27 of port 22 is generally shaped as a receptacle for an electrical jack connector. Perimeter 27 of port 22 is extended on one side to form a slot 26. A groove 28 is formed on an inside face of lower housing 14. A pair of flexible hooks 30 and 32 extend upwardly from lower housing 14 on opposite sides of housing 14 approximately halfway between end 40 and end 42 of the housing.

Three tabs 34, 36 and 38 extend from the lower face of cover 12. Cover 12 is attached to housing 14 by first placing end 40 of cover 12 on housing 14. Tab 34 extends into slot 24 to complete the perimeter 25 of the 0 serial connector port 16; tab 36 extends into slot 26 to complete the perimeter 27 of the electrical jack connector port 22; and tab 38 extends into groove 28. Thereafter, as end 42 is lowered onto housing 14, hooks 30 and 32 engage two corresponding flexible hooks 44 and 46 extending downwardly from cover 12 to hold cover 12 in place on housing 14. Two screws 48 extend through holes 52 in housing 14 and engage sockets 56 in cover 12 to prevent inadvertent removal of cover 12.

By forming the slots 24 and 26 as extensions of ports 16 and 22, respectively, rather than as separate elements, the number of features of housing 14 is minimized. The minimization of features reduces the manufacturing complexity of the apparatus and minimizes the overall cost of production. In addition, the use of only two screws to attach the cover to the housing reduces the assembly labor and therefore the manufacturing cost of the device.

We claim:

1. A housing assembly comprising:
   a first housing member and a second housing member,
   said first housing member having at least one wall portion at a first end of said housing assembly, said wall portion having at least one aperture with a main perimeter portion designed to accommodate an associated connector member having a predetermined peripheral shape, said aperture having an additional slot portion offset from the main perimeter portion,
   said second housing member including at least one tab member extending into said additional slot portion without intruding into the main perimeter portion of said aperture to assist in attaching said first housing member to said second housing member in the vicinity of said first end without interfering with the ability of said main perimeter portion to accommodate the associated connector member;
   means adjacent the opposite end of said housing assembly for securing said first and second housing members together at said opposite end; and
   hook assembly means located between said first and opposite ends of said housing assembly for securing said first and second housing members together.

2. The housing assembly of claim 1 wherein said hook assembly means comprises a first flexible hook member extending from said first housing member to said second housing member and a second flexible hook member extending from said second housing member to said first housing member, said first and second hook members being mutually engaged when said first and second housing members are mutually secured.

3. The housing assembly of claim 2 wherein said hook assembly means comprises a first pair of said first and second hook members positioned adjacent a first marginal portion of said housing assembly and a second pair of flexible hook members positioned adjacent the opposite marginal portion of said housing assembly.

4. The housing assembly of claim 1 wherein said securing means comprises at least one fastener socket secured to one of said first and second housing members and an associated fastener received in said socket and engaged with the other one of said first and second housing members.

* * * * *